(12) United States Patent
Abdelrahman et al.

(10) Patent No.: US 7,659,196 B2
(45) Date of Patent: Feb. 9, 2010

(54) SOLUBLE HARD MASK FOR INTERLAYER DIELECTRIC PATTERNING

(75) Inventors: Magdy S. Abdelrahman, Santa Clara, CA (US); Makarem A. Hussein, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/643,483

(22) Filed: Dec. 20, 2006

(65) Prior Publication Data

US 2008/0153283 A1   Jun. 26, 2008

(51) Int. Cl.
*H01L 21/4763* (2006.01)
*H01L 21/44* (2006.01)
*H01L 21/311* (2006.01)

(52) U.S. Cl. .................. 438/638; 438/672; 438/675; 438/700; 257/E21.575; 257/E21.577; 257/E21.585

(58) Field of Classification Search .................. 438/618, 438/622–629, 637, 671, 672, 675, 700–703; 257/E21.579, E21.577, E21.575, E21.585
See application file for complete search history.

(56) References Cited

U.S. PATENT DOCUMENTS

| 5,670,423 | A  | * | 9/1997  | Yoo ........................... 438/587 |
| 6,350,682 | B1 | * | 2/2002  | Liao .......................... 438/638 |
| 6,924,228 | B2 |   | 8/2005  | Kim et al. |
| 6,984,529 | B2 |   | 1/2006  | Stojakovic et al. |
| 7,132,369 | B2 |   | 11/2006 | Delgadino et al. |
| 7,176,126 | B2 | * | 2/2007  | Oh et al. ..................... 438/638 |
| 7,241,681 | B2 | * | 7/2007  | Kumar et al. ............... 438/618 |
| 2006/0286794 | A1 | * | 12/2006 | Lin et al. .................... 438/637 |
| 2007/0254476 | A1 | * | 11/2007 | Chou et al. ................. 438/643 |
| 2008/0079155 | A1 | * | 4/2008  | Mule et al. .................. 257/751 |

* cited by examiner

*Primary Examiner*—Hsien-ming Lee
(74) *Attorney, Agent, or Firm*—Blakely, Sokoloff, Taylor & Zafman LLP (57) ABSTRACT

Described herein are embodiments of a method that includes forming a hard mask over an interlayer dielectric layer, patterning said hard mask, etching said interlayer dielectric layer, and removing said hard mask during a post-etch clean with a wet etchant having a selectivity to etch said hard mask at a greater rate than said interlayer dielectric layer.

1 Claim, 6 Drawing Sheets

SOLUBLE HARD MASK FOR INTERLAYER DIELECTRIC PATTERNING

BACKGROUND OF THE INVENTION

1. Field of the Invention

The present invention relates to the field of semiconductor devices and more specifically to patterning of an interlayer dielectric layer.

2. Discussion of Related Art

The fabrication of semiconductor devices with smaller dimensions and the increasing switching speeds of transistors necessitate the use of copper lines and low-k interlayer dielectric (ILD) layers to accommodate the high speed signals. The use of the copper and low-k interlayer dielectric layers reduces the resistance of the metal interconnects and the capacitance between the metal interconnects to enable the high speed signals to be transmitted. Because process techniques used to pattern layers within a layer stack used to fabricate a semiconductor device also effect any low-k Interlayer dielectric layer included in that layer stack, exposure to the other processes alter the low-k interlayer dielectric layer from the shape or characteristics the layer was designed to exhibit.

A current solution to protect a low-k interlayer dielectric layer is to form a hard mask layer over a low-k interlayer dielectric to protect the low-k interlayer dielectric layer from processes performed on other layers. For example, an anti-reflective layer and a photoresist layer may be formed over an interlayer dielectric layer for patterning the interlayer dielectric layer as necessary to form a semiconductor device. Once the low-k interlayer dielectric layer is patterned, the remaining photoresist and anti-reflective layer must be removed. In the absence of using a hard mask layer that separates the interlayer dielectric layer from the anti-reflective and the photoresist layers, a dry or wet etch process performed to remove an anti-reflective layer and a photoresist layer would result in degradation of the interlayer dielectric layer. As mentioned above, the degradation results because the chemistries that are used to etch or remove photoresist and anti-reflective layers may damage an ILD layer. Therefore, the characteristics or dimensions of the patterns in the ILD may be significantly altered during the etching or removal of an anti-reflective and photoresist layers. This ultimately would result in unreliable operation of semiconductor devices or low manufacturing yields of properly operating semiconductor devices. Therefore, the use of a hard mask is needed to protect the ILD layer from the processes used to alter other layers.

As the dimensions of the patterns implemented in the interlayer dielectric layer decrease, the photoresist layer begins to breakdown making forming critical dimensions unreliable. To increase the reliability of patterning smaller dimensions in the interlayer dielectric layer, a thicker hard mask is needed to maintain the fidelity of a pattern printed on a mask used for photolithography. However, the use of a thicker mask prevents the proper alignment of additional layers because the alignment marks are no longer as accessible. Because proper alignment is now more difficult, manufacturing yields of semiconductor devices degrade.

Another problem with the use of a hard mask is that the hard mask is designed to protect a lower interlayer dielectric layer from chemicals and processes used in the manufacturing process making the hard mask layer difficult to remove. One method of removing the hard mask is through chemical mechanical polishing (CMP) after the deposition of an interconnect metal. Leaving the hard mask over the interlayer dielectric until after the deposition of an interconnect metal allows the interlayer dielectric layer exposed to intermediary processes that result in the interlayer dielectric layer undercutting the hard mask layer. The interlayer dielectric layer undercutting the hard mask layer during intermediary processes results in the formation of voids in metal deposited in a trench or via formed in the interlayer dielectric layer. The voids in the interconnect results in unreliable operating characteristics and performance of a semiconductor device and decreases the reliability of the semiconductor device.

DETAILED DESCRIPTION

In the following description numerous specific details are set forth in order to provide an understanding of the claims. One of ordinary skill in the art will appreciate that these specific details are not necessary in order to practice the disclosure. In other instances, well-known semiconductor fabrication processes and techniques have not been set forth in particular detail in order to prevent obscuring the present invention.

Embodiments of the present invention include a process to reduce the degradation of an interlayer dielectric layer during manufacturing of a semiconductor device while minimizing voids in the formation of interconnects. The process uses a hard mask deposited over an interlayer dielectric layer (ILD) to pattern dual damascene structures and to protect the fragile interlayer dielectric layer from damage during a semiconductor process. Moreover, an embodiment of the process uses a post-etch clean to remove dry etch polymer accumulated and to remove the hard mask prior to depositing the interconnect metal. The process allows a thinner hard mask layer to be used that prevents interfering with proper alignment of upper layers used to form a semiconductor device and minimizes the undercut of the interlayer dielectric layer to prevent the forming of voids when forming interconnects. Therefore, the process provides more predictable operating characteristics of a semiconductor device with higher manufacturing yields.

Figure 1:
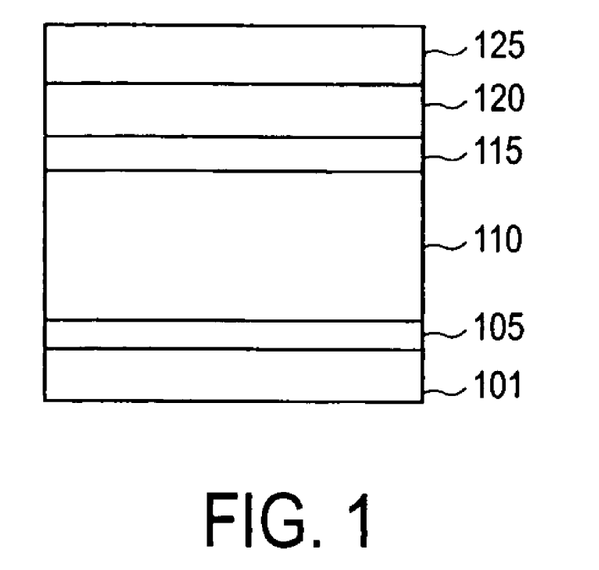
FIG. 1 is an illustration of a cross-sectional view of an embodiment of a hard mask in relationship to other layers in a step of a semiconductor manufacturing process.

The FIG. 1 embodiment illustrates an example of a formation of layers used in a semiconductor manufacturing process. An interconnect layer 101 may be formed having an interconnect formed from materials including copper, aluminum, tantalum, tantalum nitride, titanium, titanium nitride, and tungsten. An etch stop layer 105 in the FIG. 1 embodiment is formed over interconnect layer 101. Etch-stop layer 105 may be formed from silicon carbonate, silicon nitride, or any other material known in the art that can be used as an etch-stop layer. In some embodiments etch-stop layer 105 is also used as a barrier layer to prevent the migration of the metal used in the interconnect layer 101 from migrating into other layers. For other embodiments, etch-stop layer 105 may be deposited over a barrier metal cap layer covering an interconnect formed from a metal to prevent migration of a metal used in the interconnect layer 101 from migrating into another layer.

Figure 2:
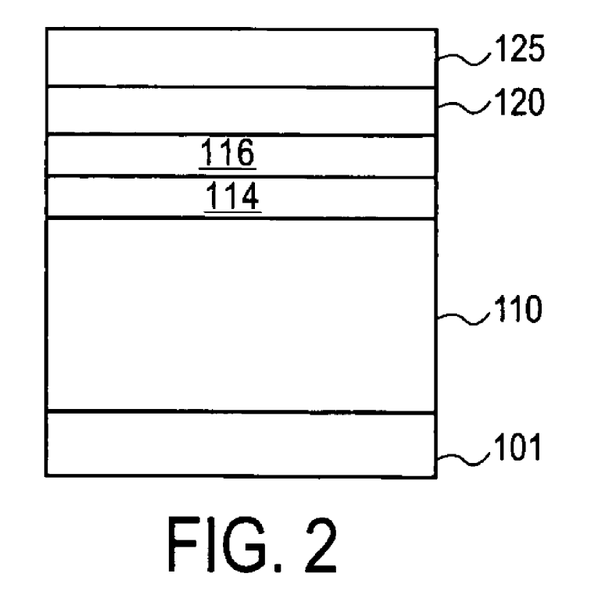
FIG. 2 is an illustration of a cross-sectional view of an embodiment of a hard mask in relationship to other layers in a step of a semiconductor manufacturing process.

One example of a barrier metal cap layer is a barrier cap layer formed from cobalt. An embodiment of a layer stack that an embodiment of the process may be performed on also includes a layer stack without an etch-stop layer, as illustrated in FIG. 2.

As shown in FIG. 1, an interlayer dielectric layer 110 may be formed over etch-stop layer 105. For an embodiment, an interlayer dielectric layer 110 is a low dielectric constant (low-k) interlayer dielectric. Another layer illustrated in the FIG. 1 embodiment is a hard mask layer 115 formed over an interlayer dielectric layer 110 to protect the interlayer dielectric layer 110 from processing preformed on the other layers. For example, the hard mask layer 115 may protect an interlayer dielectric layer 110 from processing used to pattern a dual damascene structure into an interlayer layer dielectric layer 110. For certain embodiments, an interlayer dielectric layer 110 needs to be pattered; therefore, an anti-reflective layer 120 is formed over the hard mask layer 115, as illustrated in FIG. 1. For some embodiments, an organic or inorganic bottom anti-reflective coating material may be used to form an anti-reflective layer 120 to coat hard mask layer 115 to prevent reflections of the hard mask layer 115 from interfering with lithographic patterning. A photoresist layer 125 is then deposited on the anti-reflective layer 120 of the FIG. 1 embodiment. The photoresist layer 125 may then be exposed to a photolithography process to define a pattern in the photoresist. The pattern formed in the photoresist layer 125 may then be used to etch the lower layers such as an anti-reflective layer 120, a hard mask layer 115, and an interlayer dielectric layer 110. The etching may be preformed by a wet etch or a dry etch process. Examples of a dry etch processes include reactive ion etching (RIE), plasma etching, and physical sputtering.

An embodiment of the process may include a hard mask layer 115 formed from materials known in the art to provide protection to an interlayer dielectric layer 110, such as a low-k interlayer dielectric layer. Examples of materials that may be used for a hard mask layer 115 include titanium, tantalum, titanium nitride and tantalum nitride.

Figure 3:
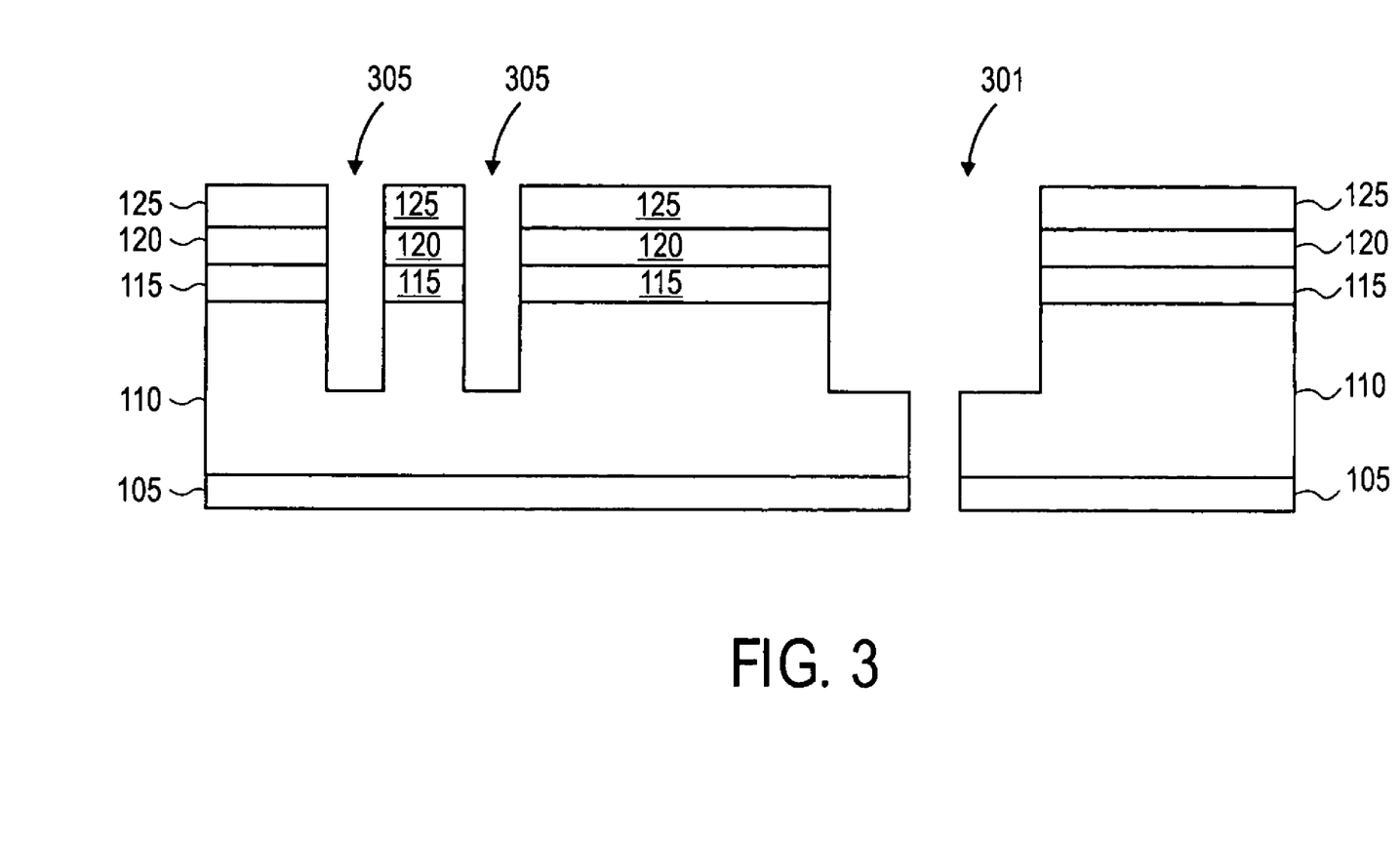
FIG. 3 is an illustration of a cross-sectional view of an embodiment of a hard mask in relationship to other layers in a step of a semiconductor manufacturing process.

The FIG. 3 illustration shows an embodiment of a Dual Damascene structure 301 and trenches 305 formed using an embodiment of the process. An embodiment of the hard mask layer 115 is used in FIG. 3 to protect an interlayer dielectric layer 110 from a process used to form trenches 305 and a Dual Damascene structure 301. Furthermore, hard mask layer 115 may be removed during the trench/via clean process. Thus, hard mask undercut of the interlayer dielectric is reduced and the creation of voids in interconnects is eliminated.

Figure 4A:
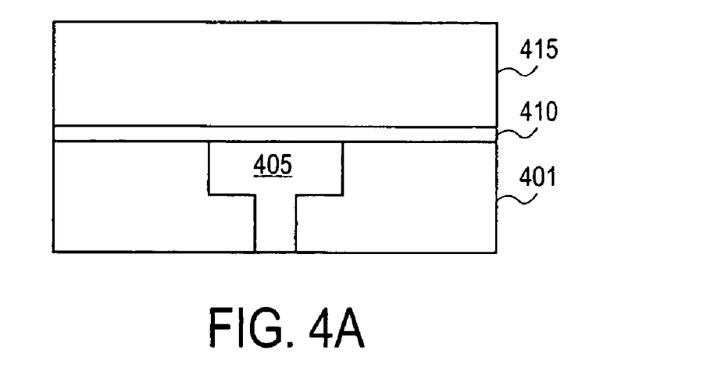
FIG. 4A-J illustrates an embodiment of a dual damascene process using an embodiment of a hard mask.

As mentioned above an embodiment of the process using a hard mask may be used to form a Dual Damascene structure. FIGS. 4A-4J illustrate a Dual Damascene process that employs an embodiment of process using a hard mask that is removed before forming an interconnect. FIG. 4A shows an embodiment of a lower interconnect layer 401 including a first interconnect 405. The first interconnect 405 may be formed from any material known in the art for creating interconnects, such as copper, aluminum, titanium, and tantalum. An embodiment, such as the one illustrated in FIG. 4A may include an etch-stop layer 410 or a hard mask formed over interconnect layer 401. Etch-stop layer 410 is used to protect the lower interconnect layer 401 from a process performed on upper layers. Alternatively, etch-stop layer 410 may be used to prevent diffusion of metal into an interlayer dielectric layer 415, such as copper diffusion from a copper first interconnect 405 into an interlayer dielectric layer 415. Etch-stop layer 410 may be formed from any material known in the art to protect lower layers from a process preformed on upper layers, such materials include silicon nitride and silicon carbide. For other embodiments, an etch-stop layer 410 is not used.

Figure 4B:
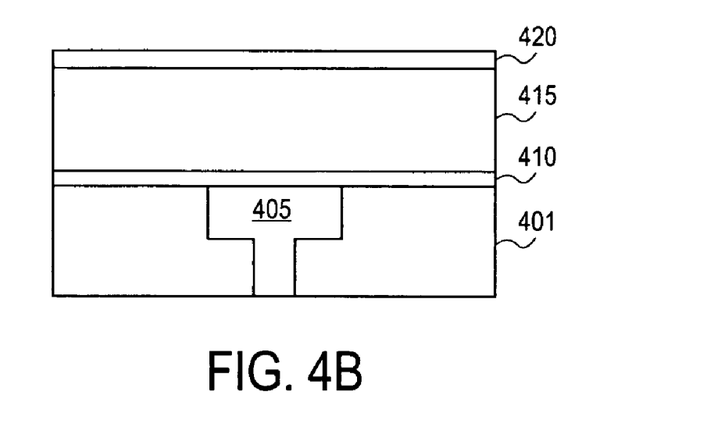

For an embodiment, an interlayer dielectric layer 415 may be formed over an interconnect layer 401 as illustrated in the FIG. 4A embodiment. The interlayer dielectric layer 415 may be formed from any material known in the art for forming interlayer dielectric layers. For one embodiment the interlayer dielectric layer is a low-k dielectric layer such as silicon dioxide, carbon-doped oxide, spin-on-polymer, or polymers deposited by plasma-enhanced chemical vapor deposition. An embodiment of the interlayer dielectric layer 415 may be formed from any method known in the art, such as chemical vapor deposition (CVD), plasma enhanced chemical vapor deposition (PECVD), and sputtering. As illustrated in FIG. 4B, an embodiment includes forming a hard mask layer 420 over an interlayer dielectric layer 415. One embodiment includes a hard mask layer 420 formed to have a thickness less than 50 nanometers. An embodiment of a hard mask layer 420 may be formed to a thickness including 10 nanometers up to 30 nanometers. The hard mask layer 420 may be formed by any method known in the art for forming a hard mask including chemical vapor deposition, plasma enhanced chemical vapor deposition, and sputtering. For an embodiment, a hard mask layer 420 is formed from titanium. The use of a hard mask layer 420, such as titanium, provides a thinner hard mask layer to be used and provides etch resistance to preserve a pattern transferred into an interlayer dielectric layer 415. Moreover, an embodiment of a hard mask layer 420 according to the present invention, such as titanium, is easy to remove using a wet chemistry with selectivity to any interconnects and an interlayer dielectric layer 415.

An embodiment of a hard mask layer 420 may be formed from a bulk material such as titanium. Other bulk materials that may be used include materials known in the art to be used for a hard mask such as the materials discussed above. Moreover, the hard mask layer 420 may be formed by processes known in the art to form a hard mask such as those discussed above. Embodiments of a hard mask layer 420, such as those composed of titanium, provide for the use of a thin hard mask layer 420. The use of a thinner hard mask provides the use of standard alignment and registration techniques. Therefore, no special alignment techniques that may increase the cost and time of a manufacturing process are needed.

Once a hard mask layer 420 is formed, other layers may be formed over the hard mask layer 420. As illustrated in the FIG. 4C embodiment, an anti-reflective layer 425 is formed over a hard mask layer 420. The anti-reflective layer 425 may be formed from any anti-reflective material known in the art that prevents profile degradation caused by reflections from a reflective hard mask including an organic anti-reflective coating or an inorganic anti-reflective coating. For an embodiment a dyed inorganic spin-on coating may be used as anti-reflective layer 425. For another embodiment the anti-reflective layer may be an organic anti-reflective material.

Figure 4C:
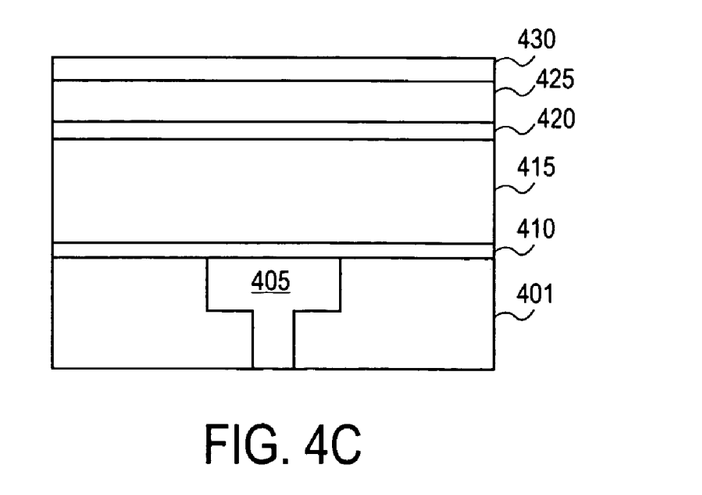
Figure 4D:
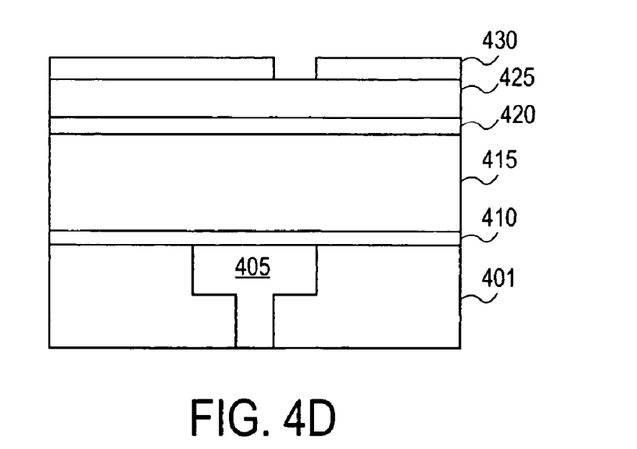
Figure 4E:
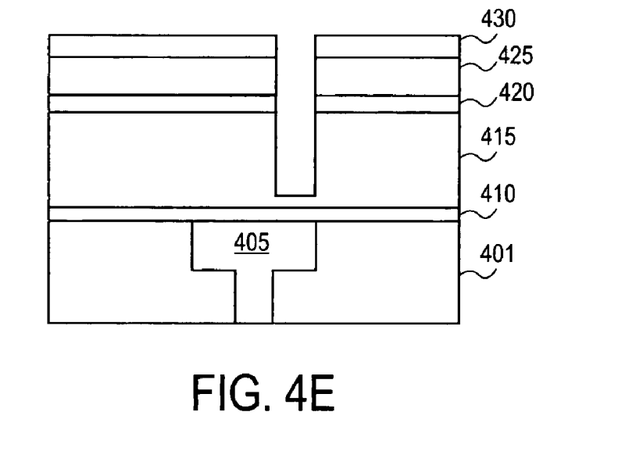

Moreover, the FIG. 4C embodiment illustrates a photoresist layer 430 formed over anti-reflective layer 425. For an embodiment as illustrated in FIG. 4D the photoresist layer 430 is pattered to expose an area for etching to form a via for as part of a process to form a Dual Damascene structure as represented in FIGS. 4A-4J. Once photoresist layer 430 is printed, the lower layers may be etched to form a via as illustrated in FIG. 4E. For an embodiment, the via is only partially etched to provide a thin layer of interlayer dielectric layer 415 to remain, as illustrated in FIG. 4E. For an embodiment employing an etch-stop layer 410, the partial via etch provides the use of a thinner etch-stop layer 410 because the thin layer of interlayer dielectric remaining at the bottom of the via adds protection to an underlying interconnect layer 405 from a subsequent process performed on the layer stack. For a partial via etch embodiment, the via etch may be completed during a trench etch process used in forming the dual damascene structure. The via may be etched using techniques known in the art including chemical etch processes and a plasma etch processes utilizing chemistries appropriate to the type of interlayer dielectric material used. The via shown in FIG. 4E is formed through an anti-reflective layer 425, a hard mask layer 420 and an interlayer dielectric layer 415.

For an embodiment of a Dual Damascene process using a hard mask layer 420, anti-reflective layer 425 and photoresist layer 430 are removed after a via is formed. Another embodiment includes removing anti-reflective layer 425 and photoresist layer 430 prior to performing a via etch. For an embodiment, anti-reflective layer 425 and photoresist layer 430 are removed using wet chemistries. Another embodiment includes removing anti-reflective layer 425 and photoresist layer 430 using a combination of a dry etch chemistry, such as a plasma ash, and a wet etch chemistry. Embodiments of the wet chemistries used to remove anti-reflective layer 425 and a photoresist layer 430 include those that selectively etch materials used for an anti-reflective layer 425 and a photoresist layer 430 over materials to form interconnects and materials used to form a hard mask.

Figure 4F:
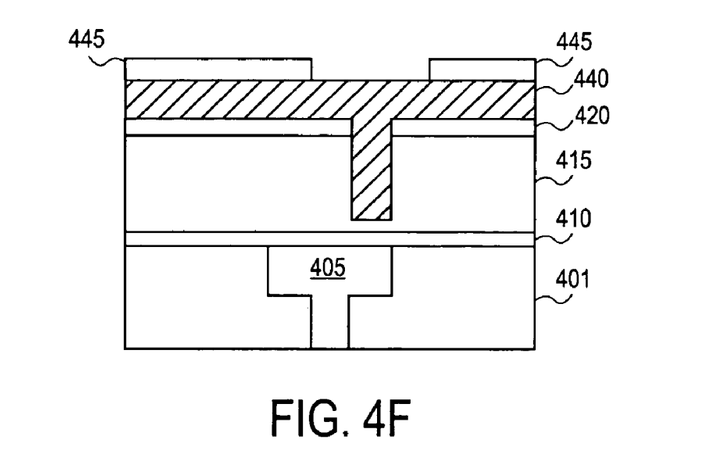
Figure 4G:
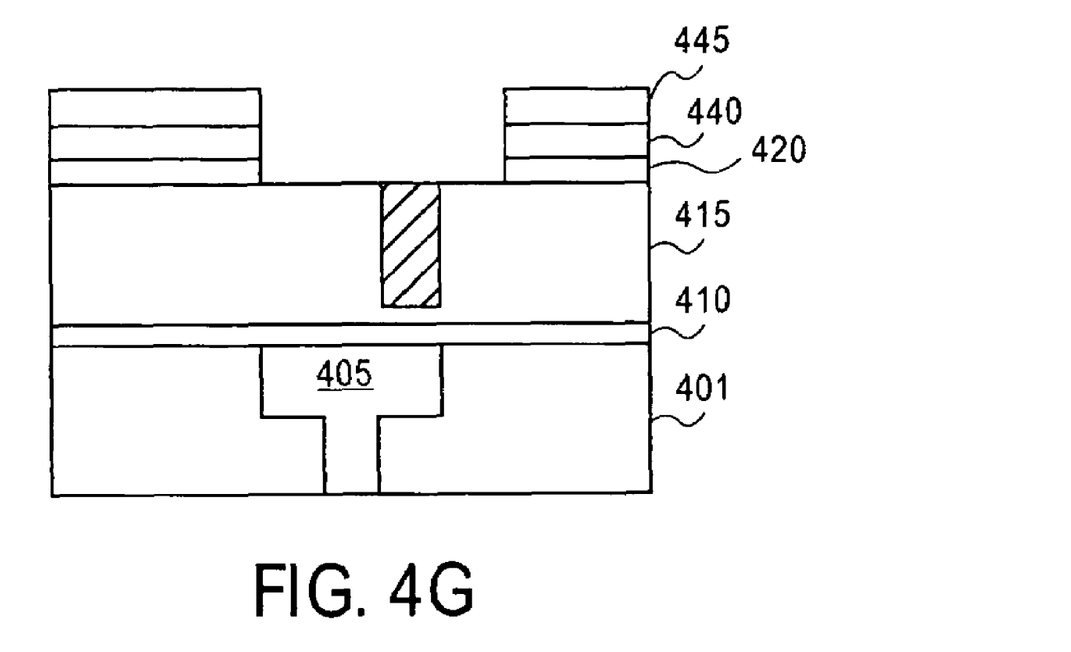

As shown in FIG. 4F, a second anti-reflective layer 440 may be formed over a hard mask layer 420. Similar to anti-reflective layer 425, a second anti-reflective layer 440 is used to minimize the reflectivity of a hard mask layer 420 residing below to prevent degradation of a photolithography process. A second photoresist layer 445 may also be formed over a second anti-reflective layer 440, as illustrated in FIG. 4F. Similar to photoresist layer 430, a second photoresist layer 445 is patterned to expose the underlying layer for forming a trench to form a Dual Damascene structure. For an embodiment, the second anti-reflective layer 440 exposed by patterning the second photoresist layer 445 and the hard mask layer 420 underneath the exposed second anti-reflective layer 440 are etched, as illustrated in FIG. 4G, in preparation of forming a trench in interlayer dielectric layer 415.

Once the etch process is complete, a second photoresist layer 445 and a second anti-reflective layer 440 may be removed. For an embodiment, a wet etch chemistry may be used to remove the second photoresist layer 445 and the second anti-reflective layer 440 illustrated in the FIG. 4G embodiment. Another embodiment includes removing the second photoresist layer 445 and the second anti-reflective layer 440 before the etch process used to form trench 450. Therefore, an embodiment includes removing second photoresist layer 445 and the second anti-reflective layer 440 using a wet etchant prior to etching a trench 450 in an interlayer dielectric layer 415.

Figure 4H:
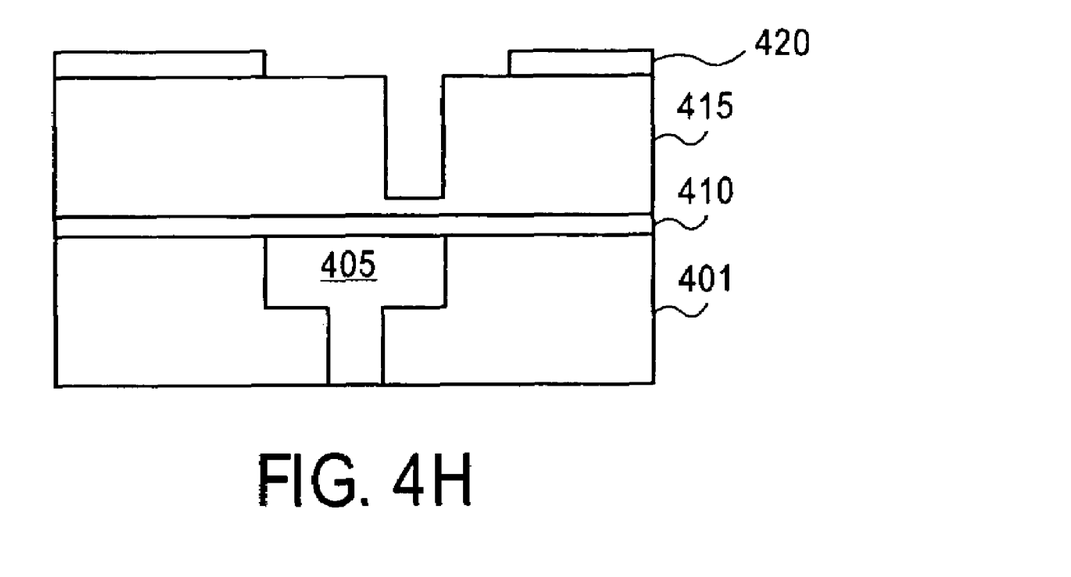

FIG. 4H illustrates an embodiment of a stack layer after a wet etch process is preformed to remove second photoresist layer 445, and anti-reflective layer 440, including any anti-reflective layer remaining in a via. One embodiment includes using a wet etchant to remove a second photoresist layer 445 and anti-reflective layer 440 that is compatible with hard mask layer 420 and the material used to form any interconnects.

Figure 4I:
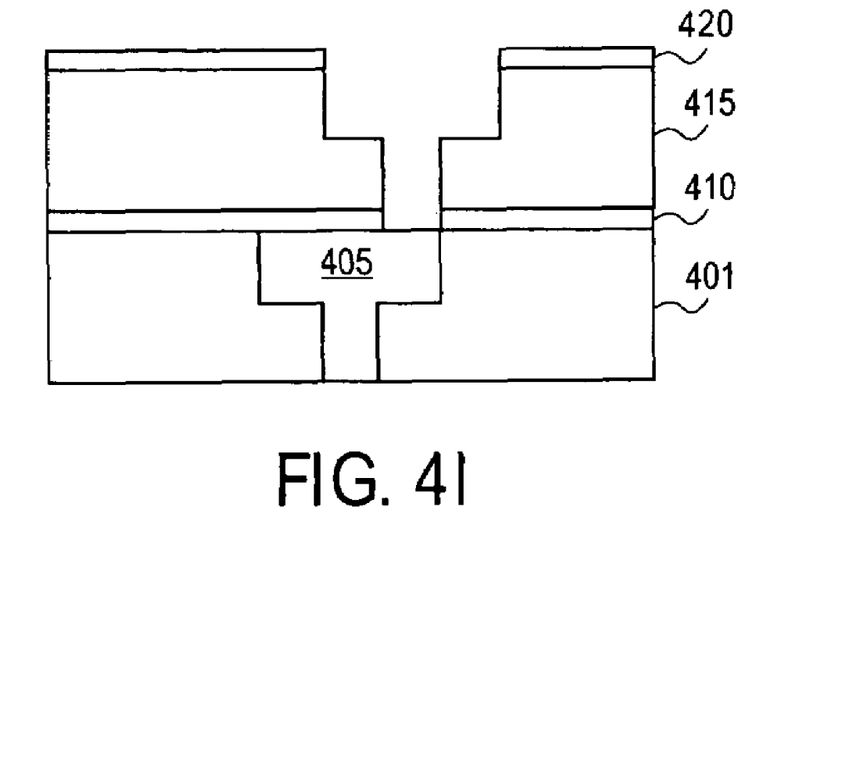

To form the trench an etch process is performed to etch a trench in interlayer dielectric layer 415, as shown in FIG. 4I. For an embodiment, the etch process used to form trench 450 in interlayer dielectric layer 415 also etches the remaining interlayer dielectric material at the bottom of the via formed in interlayer dielectric layer 415. Moreover, the etch process is used to remove the portion of etch-stop layer 410 exposed after any remaining interlayer dielectric material 415 is removed from the via. The metal interconnect 405, as shown in FIG. 4I, is now exposed by the etch process.

Some embodiments include using a post-etch clean to remove residues that accumulate during previous processes used such as dry etch polymer. For one embodiment, the post-etch clean removes both accumulated residues and hard mask layer 420. An embodiment of the wet etchant used as a post-etch clean to remove accumulated residues and hard mask layer 420 provides the removal of the accumulated residues and the hard mask layer 420 without significantly etching other materials in the layer stack, such as materials used for an interlayer dielectric layer 415, materials used for a barrier layer, and materials used to form an interconnect. Therefore, a post-etch clean minimizes damage to other materials used in a layer stack to form a semiconductor device, such as those materials used to form a dual damascene structure. Because an embodiment of a post-etch clean used to remove accumulated residues and a hard mask layer 420 without damage to other materials within a layer stack used to form a semiconductor device, the post-etch clean is compatible with the other materials used in the layer stack.

One such embodiment uses a wet etch that has a greater selectivity to a hard mask layer 420 than to other materials in a layer stack used to form a semiconductor device. For example, a post-etch, wet etchant used to remove a hard mask layer 420 may etch more of the hard mask layer 420 over a period of time than a low-k dielectric used for an interlayer dielectric layer 415, metals used for an interconnect 405 such as copper, and barrier layers such as tantalum or titanium.

For an embodiment, a post-etch, wet etchant used to remove a hard mask layer 420 has an etch selectivity to the accumulated residues and the hard mask layer 420 of 5 times that of an interlayer dielectric layer 415. Another embodiment includes using a wet etchant having an etch selectivity to a hard mask layer 420 over an interlayer dielectric layer 415 of greater than 10 to 1. Yet, another embodiment includes using a wet etchant having an etch selectivity to a hard mask layer 420 over interlayer dielectric layer 415 of greater than 100 to 1. Wet etchants used to remove hard mask layer 420 and accumulated residues include a peroxide containing chemistry. An example of a peroxide containing chemistry used a post-etch, wet etchant used to remove hard mask layer 420 and any accumulated residues is CLK-188 from Baker Chemicals.

The use of a wet etchant to remove the hard mask layer 420 having a greater selectivity to a hard mask layer 420 than to an underlying dielectric layer 415 prevents damage caused to an interlayer dielectric layer 415 through methods such as using chemical mechanical polishing to remove hard mask layer 420. Using chemical mechanical polishing to remove hard mask layer 420 may result in damage such as excess removal of interlayer dielectric layer 415 that results in a change in operating characteristics of a semiconductor device and degrades manufacturing yields of a semiconductor device.

Figure 4J:
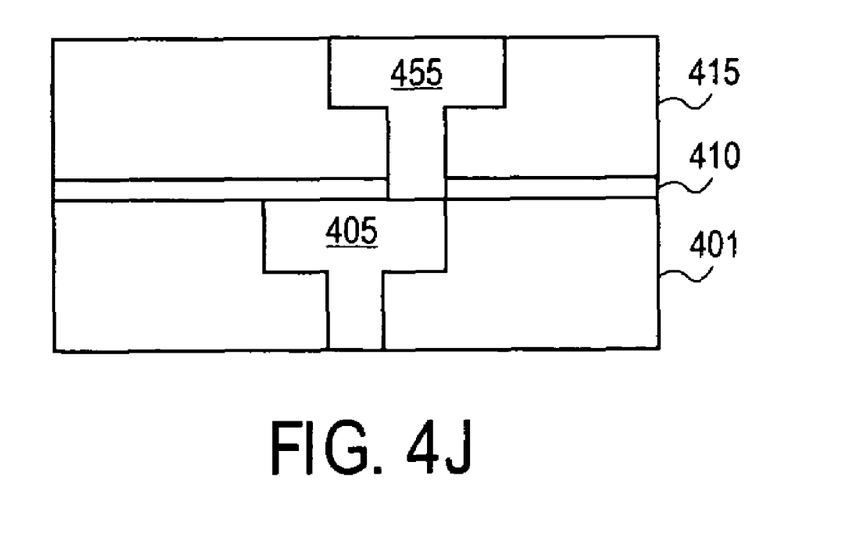

For an embodiment, a second interconnect 455 is formed in trench 450 created in interlayer dielectric layer 415, as illustrated in FIG. 4J. The second interconnect 455 may be formed by a technique known in the art for forming interconnects such as chemical vapor deposition, plasma enhanced chemical vapor deposition, electroplating, and sputtering. For embodiments of the second interconnect 455 metals such as copper, aluminum, titanium, and tantalum may be used. Other embodiments include depositing a barrier layer on the sides of trench 455 and a via prior to depositing a second interconnect 455. One such embodiment includes using a tantalum barrier layer and depositing copper over the tantalum barrier layer. Since the hard mask was removed prior to the deposition of the interconnect, the formation of voids caused by an interlayer dielectric layer 415 undercutting a hard mask layer 420 because of exposure to certain processes is eliminated. The lack of voids in interconnects increases the predictability of operating characteristics of a semiconductor device and increases the manufacturing yields of semiconductor devices.

Another embodiment of forming a Dual Damascene structure according to embodiments of the present invention includes forming a trench before forming a via. For such an embodiment, similar processes as describe above and in FIGS. 4A-4J are used. For an embodiment, once a trench has been formed in an interlayer dielectric layer, a photoresist layer is patterned for etching a via using similar techniques as discussed above to form a via. An embodiment includes etching a portion of an etch-stop layer below a via during the same process used to etch a via. Moreover, an embodiment includes using a post-etch, wet etchant, as discussed above, to remove a hard mask layer and any accumulated residues after a via is formed.

Although embodiments of the present invention have been described in language specific to structural features and/or methodological acts, it is to be understood that the embodiments of the present invention defined in the appended claims are not necessarily limited to the specific features or acts described. Rather, the specific features and acts are disclosed as particularly graceful implementations of the claimed invention.

We claim:

1. A method, comprising:
   forming a hard mask directly on an interlayer dielectric layer wherein said hard mask has a thickness greater than 10 nanometers and less than 30 nanometers and wherein said hard mask comprises titanium;
   patterning said hard mask;
   etching said interlayer dielectric layer, wherein said etching forms a partial via that leaves a portion of said interlayer dielectric layer in said partial via;
   forming a trench before removing said hard mask including:
      further patterning said hard mask, and
      etching said interlayer dielectric layer to form said trench and to completely remove said interlayer dielectric layer that remains in said partial via, wherein said trench and said via form a dual damascene structure; and, subsequently,
   removing said hard mask during a post-etch clean with a wet etchant having a selectivity to etch said hard mask at a greater rate than said interlayer dielectric layer; and
   depositing a metal in said dual damascene structure to form an interconnect after removing said hard mask.

* * * * *